United States Patent
Yamaha

(10) Patent No.: US 6,888,183 B1
(45) Date of Patent: May 3, 2005

(54) MANUFACTURE METHOD FOR SEMICONDUCTOR DEVICE WITH SMALL VARIATION IN MOS THRESHOLD VOLTAGE

(75) Inventor: Takahisa Yamaha, Hamamatsu (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 09/518,709

(22) Filed: Mar. 3, 2000

(30) Foreign Application Priority Data

Mar. 3, 1999 (JP) .......................................... 11-055341

(51) Int. Cl.$^7$ ............................................ H01L 29/76
(52) U.S. Cl. ...................... 257/288; 257/288; 257/368; 257/377; 257/384; 257/330; 257/332; 257/333; 257/334; 257/321
(58) Field of Search ......................... 257/288, 368–377, 257/384, 330, 332, 333, 334, 301

(56) References Cited

U.S. PATENT DOCUMENTS

| | | | | |
|---|---|---|---|---|
| 5,370,904 A | * | 12/1994 | Mine et al. | 427/126.2 |
| 5,674,759 A | * | 10/1997 | Jung | 437/21 |
| 5,747,830 A | * | 5/1998 | Okita | 257/72 |
| 5,861,340 A | * | 1/1999 | Bai et al. | 438/592 |
| 5,976,966 A | * | 11/1999 | Inoue | 438/618 |
| 5,997,754 A | * | 12/1999 | Yamaha et al. | 216/17 |
| 6,022,625 A | * | 2/2000 | Bremmer et al. | 428/447 |
| 6,087,206 A | * | 7/2000 | Hamada | 438/162 |
| 6,114,186 A | * | 9/2000 | Jeng et al. | 438/62.3 |
| 6,184,115 B1 | * | 2/2001 | Kou et al. | 438/586 |
| 6,194,328 B1 | * | 2/2001 | Chen et al. | 438/775 |
| 6,210,749 B1 | * | 4/2001 | Bremmer et al. | 427/126.2 |
| 6,251,805 B1 | * | 6/2001 | Yamaha et al. | 438/782 |

FOREIGN PATENT DOCUMENTS

| | | |
|---|---|---|
| JP | 63-244628 | 10/1988 |
| JP | 7-122551 | 5/1995 |
| JP | 8-45926 | 2/1996 |
| JP | 8-222633 | 8/1996 |
| JP | 9-330982 | 12/1997 |
| JP | 10-074755 | 3/1998 |

OTHER PUBLICATIONS

Japanese Office Action issued Jul. 4, 2000.
English–language concise explanationof relevance of the threee Japanese–language documents listed herein.
Technical Report of the Institute of Electronics, Information and Communication Engineers, vol. 97, No. 508, SDM97–181, Jan. 23, 1998, pp. 25–32.

* cited by examiner

*Primary Examiner*—Allan R. Wilson
*Assistant Examiner*—Edgardo Ortiz
(74) *Attorney, Agent, or Firm*—Dickstein, Shapiro, Morin & Oshinsky, LLP.

(57) ABSTRACT

After a MOS type transistor is formed on the surface of a semiconductor substrate, an interlayer insulating film covering the transistor is formed. The insulating film includes a silicon oxide film made of hydrogen silsesquioxane resin in a ceramic state. After a wiring layer is formed on the insulating film, a silicon oxide film as a surface protection film is formed on the insulating film, covering the wiring layer. In order to reduce process damages, heat treatment is performed 30 minutes at 400° C. in a nitrogen gas atmosphere. With this heat treatment, hydrogen in the silicon oxide film is released and diffuses into the channel region of the transistor to lower interfacial energy levels. Since the silicon nitride film does not transmit hydrogen, it is not necessary for the heat treatment atmosphere to contain hydrogen. A variation in threshold voltages of MOS type transistors can be easily lowered.

10 Claims, 10 Drawing Sheets

MANUFACTURE METHOD FOR SEMICONDUCTOR DEVICE WITH SMALL VARIATION IN MOS THRESHOLD VOLTAGE

This application is based on Japanese Patent Application HEI 11-055341 filed on Mar. 3, 1999, all the contents of which are incorporated herein by reference.

BACKGROUND OF THE INVENTION a) Field of the Invention

The present invention relates to a method of manufacturing a semiconductor device with MOS transistors (insulated gate type field effect transistors), and more particularly to techniques capable of easily lowering a variation in threshold voltages of MOS transistors by forming a wiring layer on an interlayer insulating film including a hydrogen containing film, forming a silicon nitride film as a surface protection film (passivation film) on the wiring layer, and thereafter performing heat treatment to lower interface state density.

b) Description of the Related Art

In a semiconductor device having a surface protection film, for example, as shown in FIG. 6, on the surface of an interlayer insulating film 1, wiring layers 2A and 2B near to each other are formed, and a silicon nitride film 3 as the surface protection film is formed on the interlayer insulating film 1, covering the wiring layers 2A and 2B (e.g., refer to JP-A-63-244628).

A channel region of a MOS transistor may have process damages during manufacture. As a method of lowering a variation in threshold voltages of MOS transistors by lowering interfacial energy levels generated by process damages, a hydrogen annealing process is known which performs heat treatment of a wafer in a nitrogen gas atmosphere which contains hydrogen after wiring layers and the like are formed (e.g., refer to Technical Report of the Institute of Electronics, Information and Communication Engineers, Vol. 97, No. 508, SDM97-181 (Jan. 23, 1998), pp. 25–32).

As a similar nitrogen annealing process, a method of performing heat treatment in a nitrogen gas atmosphere for a semiconductor device shown in FIG. 7 is known (e.g., refer to JP-A-HEI 8-45926). FIG. 7 shows a transistor in a MOS type IC. As shown, on the surface of a semiconductor substrate 5 made of silicon or the like, a field insulating film 6 is formed through local oxidation of silicon (LOCOS). On the silicon substrate surface in an active area where the field insulating film 6 is not formed, a MOS transistor Tr is formed.

The transistor Tr is formed by the following processes. The silicon substrate surface is oxidized through thermal oxidation or the like to form a gate insulating film A. On this gate insulating film A, a polysilicon layer, a silicide layer and a hydrogen containing $Si_xN_y$ (or $Si_xO_yN_z$) film are sequentially formed. This stacked-layer structure is patterned by well-known photolithography techniques and anisotropic dry etching to form a gate electrode layer B. The $Si_xN_y$ (or $Si_xO_yN_z$) film functions as an antireflection film for mitigating the influence of reflection light from the silicide layer during the exposure of the photolithography process. After the etching process, the $Si_xN_y$ (or $Si_xO_yN_z$) film is left as a layer C on the gate electrode layer B, having the same pattern as the gate electrode layer B. By using as a mask the lamination of the gate insulating film A, gate electrode layer B, and $Si_xN_y$ (or $Si_xO_yN_z$) film C and field insulating film 6, impurities are selectively introduced to form a source region $P_1$ and a drain region $P_2$ having a relatively low impurity concentration. Side spacers $E_1$ and $E_2$ of silicon oxide or the like are formed on side walls of the lamination of the gate insulating film A, gate electrode layer B and $Si_xN_y$ (or $Si_xO_yN_z$) film C. Then, a source region $Q_1$ and a drain region $Q_2$ having a relatively high impurity concentration are formed by a selective impurity doping process by using as a mask the lamination of the gate insulating film A, gate electrode layer B and $Si_xN_y$ (or $Si_xO_yN_z$) film C, the side spacers $E_1$ and $E_2$ and field insulating film 6. A lightly doped drain (LDD) structure can therefore be formed.

A barrier film 7 of silicon nitride is formed over the substrate, covering the transistor Tr and field insulating film 6. On this barrier film 7, an interlayer insulating film 8 made of, for example, borophospho silicate glass (BPSG), is formed. Contact holes 8s and 8d are formed through the stacked-layer structure of the barrier layer 7 and interlayer insulating film 8, reaching the surfaces of the source region $Q_1$ and drain region $Q_2$. In this state, heat treatment is performed in a hydrogen containing nitrogen gas atmosphere. Hydrogen in the $Si_xN_y$ (or $Si_xO_yN_z$) film C and hydrogen in the heat treatment atmosphere are supplied to the channel region of the transistor Tr. Interfacial energy levels of the channel region therefore lower. The barrier film 7 suppresses the diffusion of hydrogen in the $Si_xN_y$ (or $Si_xO_yN_z$) film C into the interlayer insulating film 8.

In the surface protection structure shown in FIG. 6, the dielectric constant of the silicon nitride film 3 is as high as about 7. Therefore, the electrostatic capacitance between the wiring layers 2A and 2B becomes large, which hinders a high speed operation and a large operation margin.

In order to reduce the wiring capacitance, it can be thought of that the silicon nitride film 3 is formed as thin as indicated by a broken line 3a in FIG. 6 and as can form a groove GV between the wiring layers 2A and 2B. Since air having the dielectric constant of 1 is filled in the groove GV, the wiring capacitance can be reduced.

However, if the silicon nitride film 3 is made thin, the hydrogen annealing process for lowering interfacial energy levels is associated with the following problems. If the hydrogen annealing process is performed before the silicon nitride film 3 is formed, hillocks (lateral hillocks) are formed laterally from the wiring layers 2A and 2B made of Al or Al alloy, which may cause a short circuit between the wiring layers 2A and 2B. On the other hand, if the hydrogen annealing process is performed after the silicon nitride film 3 is formed, interface state density cannot be lowered because hydrogen is hard to transmit through the silicon nitride film 3.

If the silicon nitride film 3 is to be formed by plasma chemical vapor deposition (CVD), silane, ammonium or the like is used as source gas. The silicon film 3 formed by using such gas has not the composition of perfect $Si_3N_4$, but contains unreacted hydrogen (such as N—H and Si—H). Although this unreacted hydrogen released by the hydrogen annealing process contributes to lowering the interfacial energy levels, the contribution degree is insufficient. The interfacial energy level lowering effect is insufficient particularly when the silicon nitride film 3 is made thin as described above. It can be also through of that a Ti layer as a barrier metal layer is formed as the lowermost layer of the wiring layers 2A and 2B to prevent the formation of hillocks. However, the Ti layer absorbs hydrogen and the interfacial energy level lowering effect is further lowered (refer to the previously-cited "Technical Report").

In the case of the hydrogen annealing process applied to the transistor Tr shown in FIG. 7, hydrogen in the $Si_xN_y$ (or $Si_xO_yN_z$) film C is supplied to the channel region of the transistor Tr and hydrogen in the heat treatment atmosphere is also supplied via the contact holes 8s and 8d to the channel region. It is necessary to provide two hydrogen supply sources and the process control becomes complicated.

If a silicide layer is to be formed on the source region $Q_1$, gate electrode layer B and drain region $Q_2$ by a so-called salicide process, it is necessary to remove the $Si_xN_y$ (or $Si_xO_yN_z$) film C before the hydrogen annealing process. Therefore, this film cannot be utilized as the hydrogen supply source during the hydrogen annealing process. In other words, the salicide process cannot be adopted if the film C is used as the hydrogen supply source.

SUMMARY OF THE INVENTION

It is an object of the present invention to provide a novel method of manufacturing a semiconductor device capable of easily lowering a variation in threshold voltages of MOS type transistors.

According to one aspect of the present invention, there is provided a method of manufacturing a semiconductor device comprising the steps of: forming a MOS type transistor on a semiconductor substrate; forming an interlayer insulating film including a hydrogen containing layer, the interlayer insulating film covering the MOS type transistor; forming a wiring layer on the interlayer insulating film; forming a hydrogen transmission preventing film covering the MOS type transistor and the wiring layer; and releasing hydrogen from the hydrogen containing film.

During the heat treatment, hydrogen in the hydrogen containing film of the interlayer insulating film is released and diffuses in to the channel region of the MOS transistor to thereby lower interface state density of the channel region. The interlayer insulating film including the hydrogen containing film covers not only the gate electrode layer but also the MOS type transistor and a silicon nitride film to be used as the hydrogen transmission preventing film prevents hydrogen in the hydrogen containing film from diffusing into the upper layer. It is therefore possible to sufficiently lower the interfacial energy levels of the channel region. Further, since the silicon nitride film does not transmit external hydrogen therethrough, it is possible to used a nitrogen gas atmosphere not containing hydrogen, as the heat treatment atmosphere. It is therefore possible to easily lower a variation in threshold voltages of MOS type transistors.

In the step of forming a MOS type transistor, metal made in contact with the source region, gate electrode layer and drain region may be silicided and the unreacted metal is removed to form the suicide layer. Since the hydrogen containing film is not formed on the gate electrode layer but included in the interlayer insulating film, the silicide layer can be formed by a salicide process.

In the step of forming the wiring layer, a plurality of adjacent wiring layers may be formed, and in the step of forming the silicon nitride film, it may be formed as thin as can cover the wiring layers and form grooves between adjacent wiring layers. Since air having a dielectric constant of 1 is filled in the grooves, a electrostatic capacitance between wiring layers can be reduced. Furthermore, the heat treatment for lowering interfacial energy levels is performed after the silicon nitride film covering the wiring layers is formed. Therefore, even if the wiring layers are made of Al or Al alloy, hillocks are not formed and a short circuit between wiring layers can be avoided.

The step of forming the interlayer insulating film may form a silicon oxide film made of hydrogen silsesquioxane resin in a ceramic state, as the hydrogen containing film. It is therefore possible to control the hydrogen content in the silicon oxide film as the hydrogen containing film in accordance with the conditions of the heat treatment for changing to the ceramic state. The manufacture yield can thus be improved.

Hydrogen release characteristics between a heat treatment temperature and a hydrogen release amount of the hydrogen containing film may be prepared in advance to perform the heat treatment at a temperature determined from the hydrogen release characteristics. It is therefore possible to reliably lower the interfacial energy levels and improve the manufacture yield.

According to another aspect of the present invention, there is provided a semiconductor device comprising: a semiconductor substrate; a MOS type transistor formed on the semiconductor substrate, the MOS type transistor including a source, a gate and a drain; an interlayer insulating film formed on the semiconductor substrate, the interlayer insulating film covering the MOS type transistor and including a hydrogen resident film; a wiring layer formed on the interlayer insulating film; and a hydrogen transmission preventing film covering the MOS type transistor and the wiring layer.

As above, after the wiring layer is formed on the interlayer insulating film including the hydrogen containing film and the surface protection film is formed on the interlayer insulating film, covering the wiring layer, heat treatment for lowering interfacial energy levels is performed. Accordingly, it is not necessary for the heat treatment atmosphere to contain hydrogen, and a variation in threshold voltages of MOS type transistors can be lowered.

MOS-type transistor includes a transistor with a gate electric film made by not only silicon oxide but also made by other dielectric films with higher dielectric constant (MIS-type transistor).

BRIEF DESCRIPTION OF THE DRAWINGS

FIG. 3 is a cross sectional view of the substrate shown in FIG. 2A and formed with interlayer insulating films, wiring layers, a surface protection film and the like.

DETAILED DESCRIPTION OF THE PREFERRED EMBODIMENTS

A MOS type IC manufacture method according to an embodiment of the invention will be described with reference to FIG. 1, FIGS. 2A to 2I and FIG. 3.

Figure 1:
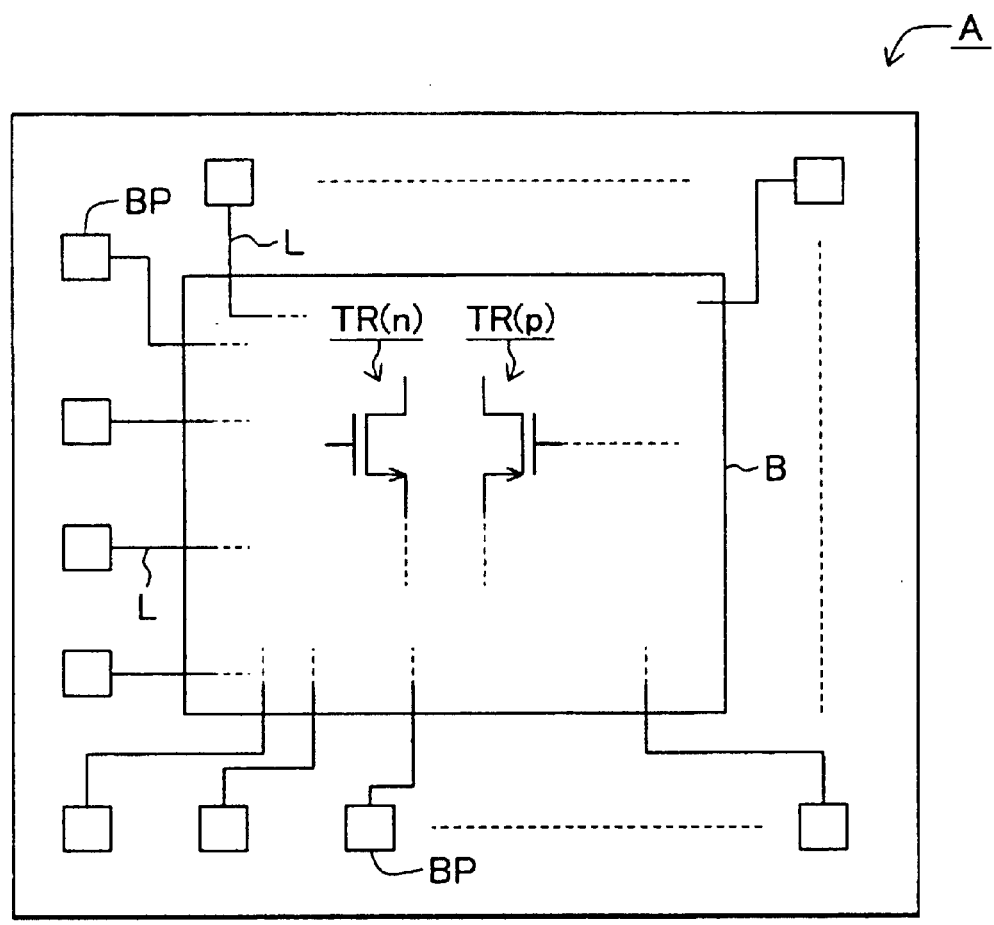
FIG. 1 is a plan view of a MOS type IC according to an embodiment of the invention.

FIG. 1 is a schematic plan view of a MOS type IC. As shown in FIG. 1, a MOS type IC A has an integrated circuit area B formed with an integrated circuit, and a number of bonding pads BP disposed around the integrated circuit area B. The integrated circuit in the integrated circuit area B has a number of MOS transistors. A CMOS type IC is made of basic CMOS circuits each constituted of pairs of one n-channel MOS transistor TR(n) and one p-channel MOS transistor TR(p). Transistors, CMOS circuits and bonding pads BP are electrically connected by wiring patterns L.

Figure 2A:
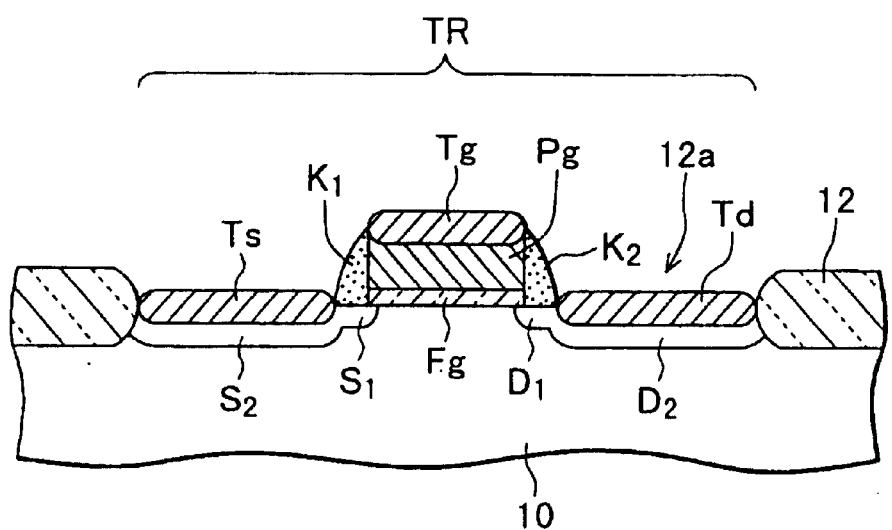
FIG. 2A is a cross sectional view of a substrate illustrating a MOS type transistor forming process of a MOS type IC manufacture method according to an embodiment of the invention.

Next, a manufacture method for a CMOS circuit will be described. As shown in FIG. 2A, on the surface of a semiconductor substrate 10 made of, for example, silicon, a field insulating film (silicon oxide film) 12 defining an active region 12a is formed by LOCOS. For example, the thickness of the field insulating film 12 is 400 nm. A MOS type transistor TR is formed on the substrate surface in the active region 12a as in the following.

In forming a transistor TR, a gate insulating film Fg is formed on the substrate surface through selective oxidation or the like. After a polysilicon layer is deposited on the gate insulating film Fg, this stacked-layer structure is patterned by photolithography techniques and an anisotropic dry etching process to form a gate electrode layer Pg. By using as a mask the lamination of the gate insulating film Fg and gate electrode layer Pg and the insulating film 12, a source region $S_1$ and a drain region $D_1$ having a relatively low impurity concentration are formed by a selective impurity doping process. The impurity doping process may be an ion implantation process. Next, side spacers $K_1$ and $K_2$ of silicon oxide or the like are formed on side walls of the lamination of the gate insulating film Fg and gate electrode layer Pg. Then, a source region $S_2$ and a drain region $D_2$ having a relatively high impurity concentration are formed by a selective impurity doping process by using as a mask the lamination of the gate insulating film Fg and gate electrode layer Pg, the side spacers $K_1$ and $K_2$ and field insulating film 12.

Next, a titanium layer is formed over the substrate surface to a thickness of 30 nm by sputtering, the titanium layer being in contact with the source region $S_2$, gate electrode layer Pg and drain region $D_2$. Titanium silicide layers Ts, Tg and Td are formed on the source region $S_2$, gate electrode layer Pg and drain region $D_2$, by heat treatment for 30 seconds at 670° C. Thereafter, unreacted titanium layers on the field insulating film 12 and side spacers $K_1$ and $K_2$ are removed, for example, with hydrofluoric acid etchant. Heat treatment is performed for 10 seconds at 870° C. to progress crystallization of the silicide layers Ts, Tg and Td and lower the resistance thereof.

Figure 2B:
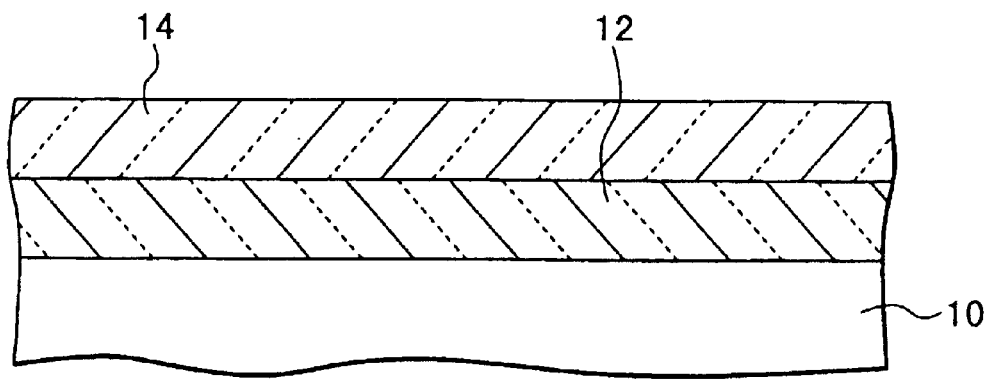
FIG. 2B is a cross sectional view of the substrate illustrating an interlayer insulating film forming process to follow the process shown in FIG. 2A.
Figure 2C:
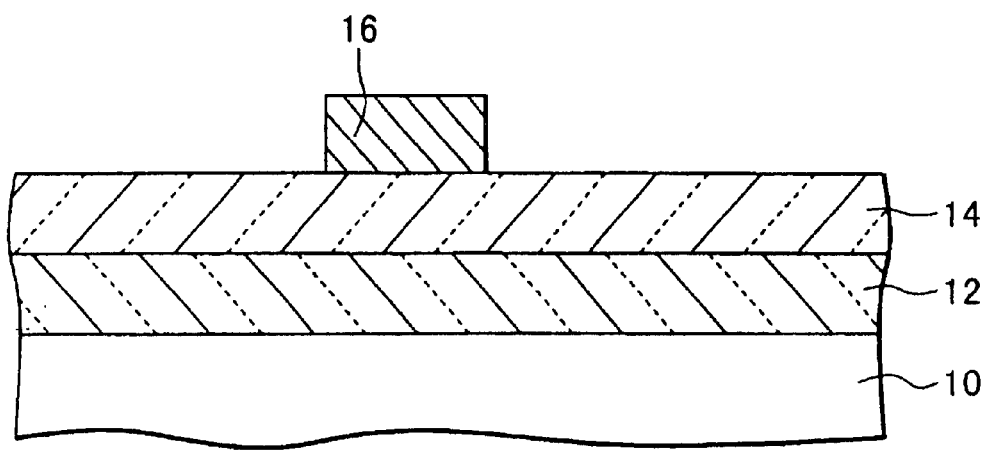
FIG. 2C is a cross sectional view of the substrate illustrating a wiring layer forming process to follow the process shown in FIG. 2B.
Figure 2D:
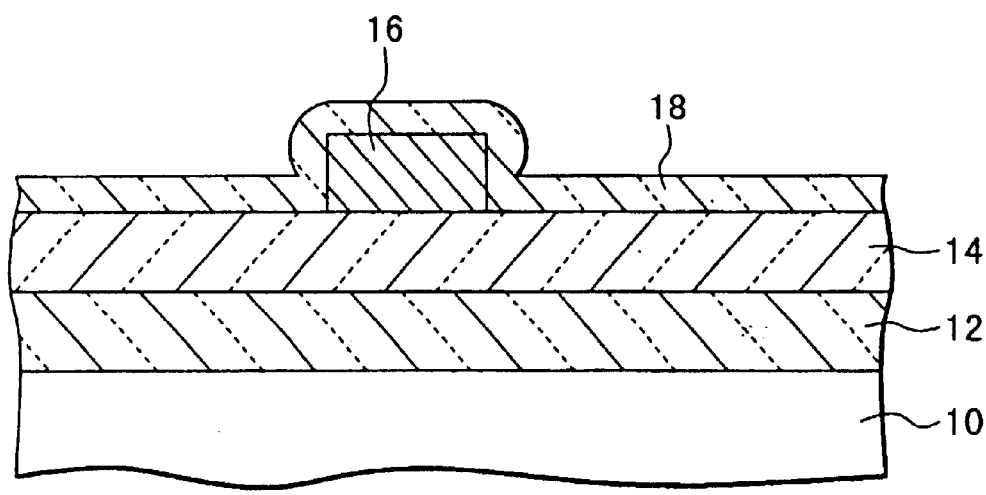
FIG. 2D is a cross sectional view of the substrate illustrating an insulating film forming process to follow the process shown in FIG. 2C.
Figure 2E:
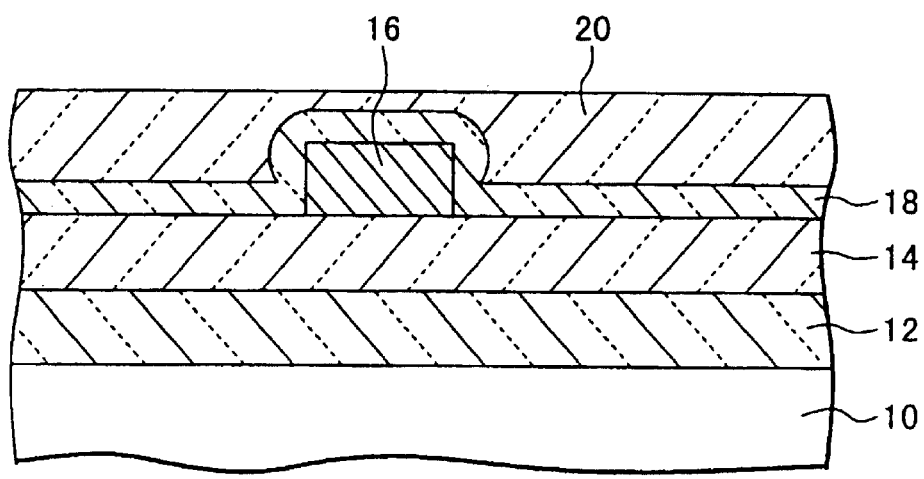
FIG. 2E is a cross sectional view of the substrate illustrating a silicon oxide film forming process to follow the process shown in FIG. 2D.
Figure 2F:
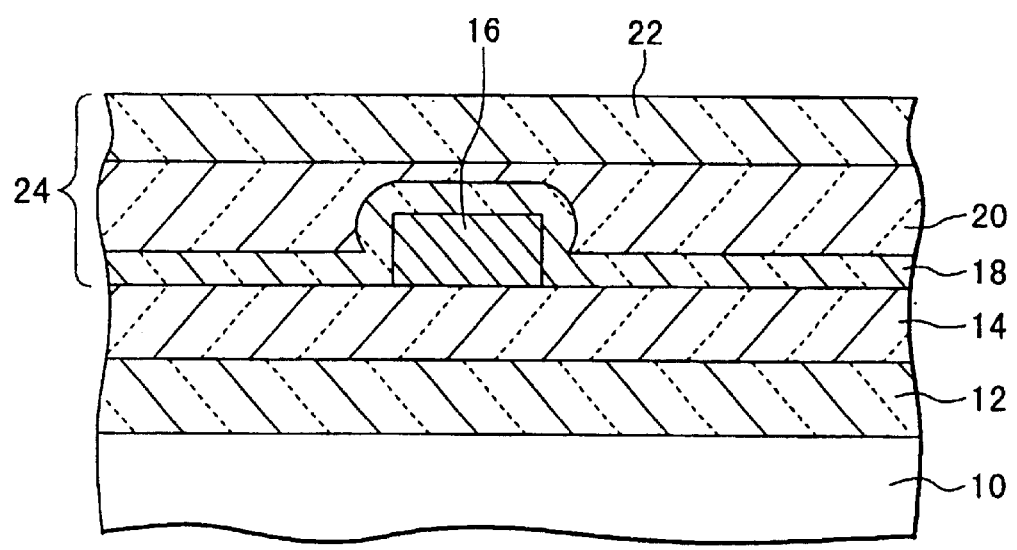
FIG. 2F is a cross sectional view of the substrate illustrating an insulating film forming process to follow the process shown in FIG. 2E.
Figure 2G:
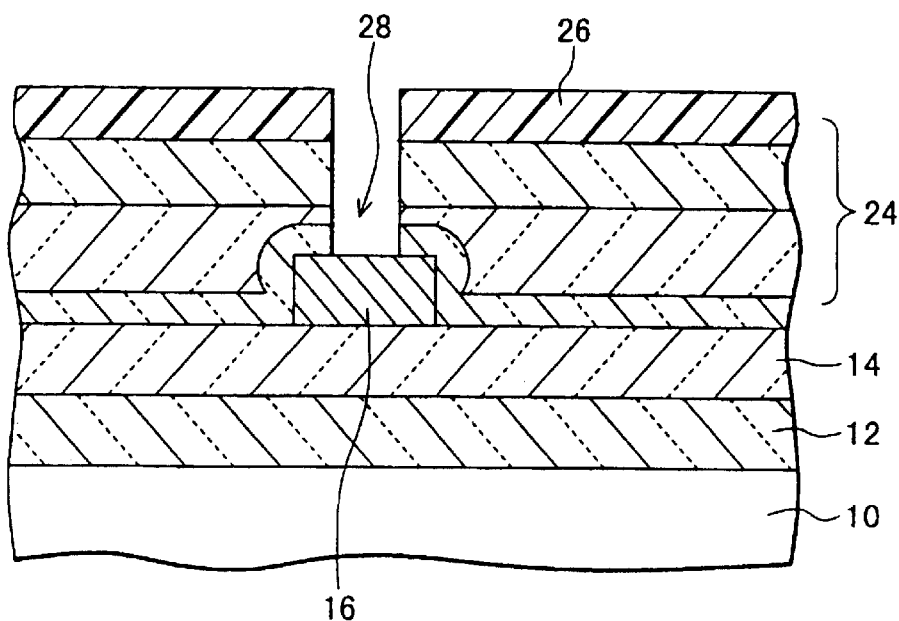
FIG. 2G is a cross sectional view of the substrate illustrating a contact hole forming process to follow the process shown in FIG. 2F.
Figure 2H:
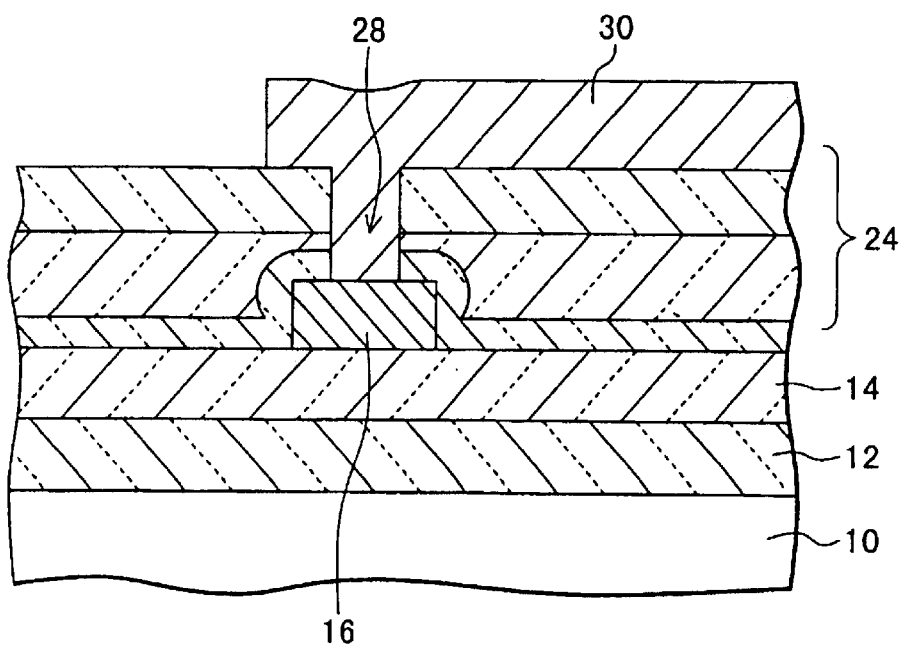
FIG. 2H is a cross sectional view of the substrate illustrating a wiring layer forming process to follow the process shown in FIG. 2G.
Figure 2I:
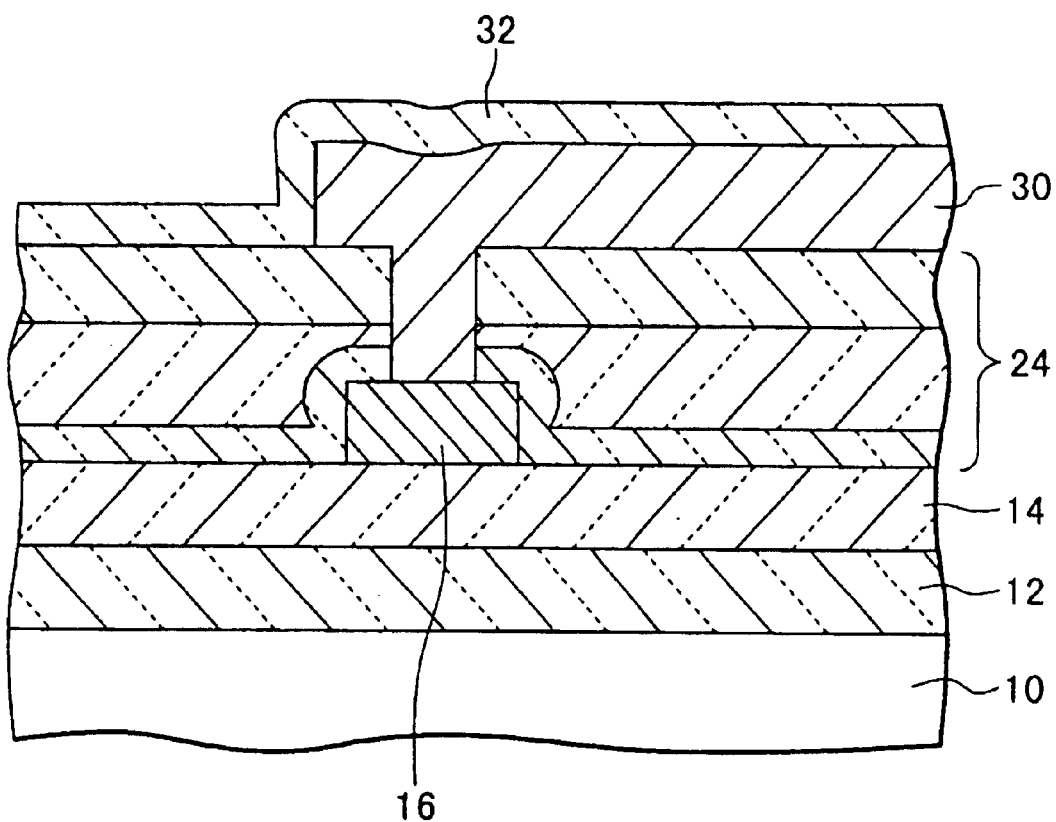
FIG. 2I is a cross sectional view of the substrate illustrating a surface protection film forming process to follow the process shown in FIG. 2H.
Figure 3:
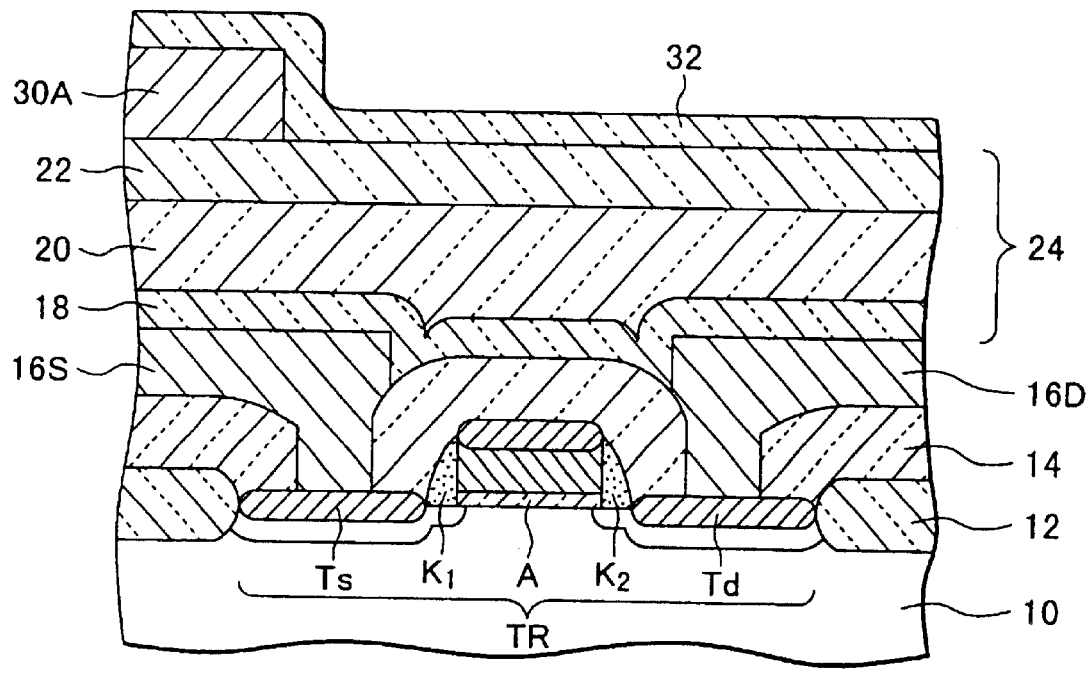

After the transistor Tr is formed by the above-described processes, an interlayer insulating film 14 is formed as shown in FIG. 2B and FIG. 3, covering the transistor TR and field insulating film 12. In FIG. 2B and following drawings, only the field area is shown. FIG. 3 shows the final structure of the transistor area. The processes of forming a CMOS type IC will be described with reference to FIGS. 2B to 2I and FIG. 3.

The insulating film 14 is a BPSG film having a thickness of 750 nm formed by atmospheric pressure CVD. The conditions of forming this film may be:

Substrate temperature: 400° C.
Source gas: $SiH_4$ (46.25 sccm)
+$PH_3$ (8.75 sccm)
+$B_2H_6$ (7.5 sccm)
+$O_2$ (7000 sccm)
+$N_2$ (50000 sccm)

In order to make the BPSG film dense, a lamp annealing process is performed under the following conditions:

Substrate temperature: 850° C.
Time to 850° C.: 10 sec
Time at 850° C.: 10 sec

Next, contact holes are formed through the insulating film 14 by photolithography and anisotropic dry etching, the contact holes reaching the silicide layers Ts and Td as shown in FIG. 3. Thereafter, as shown in FIG. 2C and FIG. 3, wiring layers 16S, 16D and 16 are formed on the insulating film 14. The wiring layers 16S and 16D are being connected to the silicide layers Ts and Td.

The wiring layers 16S, 16D and 16 are formed by depositing wiring material over the substrate surface and thereafter selectively patterning the deposited layer by photolithography and anisotropic dry etching. The wiring material is made of Ti (20 nm), TiON (100 nm), Al alloy (e.g., Al—Si—Cu, 400 nm), Ti (10 nm) and TiN (40 nm), respectively deposited in this order from the substrate side by sputtering. This wiring material layer is dry etched to form the wiring layers. The conditions of dry etching the wiring material layer may be:

Etching gas: $Cl_2$ (30 sccm)+$BCl_3$ (30 sccm)
Etching chamber pressure: 10 mTorr Next, as shown in FIG. 2D and FIG. 3, an insulating film 18 is formed on the insulating film 14, covering the wiring layers 16S, 16D and 16. The insulating film 18 is a silicon oxide film having a thickness of 150 nm formed by plasma CVD. The conditions of forming this film may be:

Substrate temperature: 400° C.
Source gas: $SiH_4$ (240 sccm)+$N_2O$ (5000 sccm)
+$N_2$ (2800 sccm)
Reaction chamber pressure: 2.2 Torr Next, as shown in FIG. 2E and FIG. 3, a silicon oxide film 20 is formed over the substrate surface, the silicon oxide film 20 covering the wiring layers 16S, 16D and 16 under the insulating film 18 and covering the transistor TR under the insulating films 18 and 14. The silicon oxide film 20 is formed, for example, by the following process. Solution of hydrogen silsesquioxane resin dissolved in methylisobutylketone (MIBK) is coated on the substrate upper surface with a spin coater to a thickness of 500 nm. Thereafter, the coated resin is thermally processed in an inert gas atmosphere to change it to a silicon oxide film in a pre-ceramic state.

Next, this silicon oxide film is thermally processed in an oxidizing atmosphere to change it to a silicon oxide film 20 in a ceramic state. The surface of the silicon oxide film 20 is being planarized. For example, the heat treatment conditions for changing to the pre-ceramic state are one minute at 150° C.+one minute at 200° C.+one minute at 300° C. in the nitrogen ($N_2$) gas atmosphere. The heat treatment for changing the pre-ceramic state to the ceramic state may be performed by using a hot plate type heating system the details of which are given, for example, in JP-A-HEI 10-18958. Atmospheric air is utilized for the oxidizing atmosphere. The heat treatment conditions may be selected from at least the conditions 1 to 6 shown in Table 1.

TABLE 1

|  | 1 | 2 | 3 | 4 | 5 | 6 |
|---|---|---|---|---|---|---|
| Heat treatment temperature [° C.] | 400 | 400 | 400 | 420 | 450 | 450 |
| Heat treatment time [min] | 6 | 6 | 12 | 6 | 6 | 10 |
| $N_2$ flow rate [l/min] | 31.2 | 16.2 | 31.2 | 31.2 | 31.2 | None |
| Si-H residue ratio [%] | 57 | 57 | 24 | 42 | 23 | 61 |

In Table 1, "Si—H residue ratio" indicates a change in the content of Si—H groups in the silicon oxide group before and after the heat treatment for the ceramic state. The smaller the Si—H residue ratio, the more the reaction to the ceramic state progresses. In the heat treatment for lowering interfacial energy levels to be described later, the longer the Si—H residue ratio maintains at a high value, the hydrogen release amount increases during this heat treatment. Therefore, the heat treatment conditions for the ceramic state can be selected and set by taking into consideration the hydrogen amount necessary for lowing the interfacial energy levels.

Next, as shown in FIG. 2F and FIG. 3, an insulating film 22 is formed on the upper substrate surface, covering the wiring layers 16S, 16D and 16 under the silicon oxide film 20 and insulating film 18 and covering the transistor TR under the silicon oxide film 20 and insulating films 18 and 14. The insulating film 22 is a silicon oxide film having a thickness of 300 nm formed by plasma CVD using TEOS (tetraethlorthosilane ($Si(OC_2H_5)_4$)) and $O_2$ as source gas. For example, the conditions of forming this film are:

Substrate temperature: 400° C.
Source gas: TEOS (1.8 cc/min in liquid)
+$O_2$ (8000 sccm)
Reactive chamber pressure: 2.2 Torr The stacked-layer structure of the insulating film 18, silicon oxide film 20 and insulating film 22 is used as an interlayer insulating film 24.

Next, as shown in FIG. 2G, a resist layer 26 having a hole corresponding to a desired contact hole is formed on the interlayer insulating film 24 by photolithography. A contact hole 28 is formed through the interlayer insulating film 24 by anisotropic dry etching by using the resist layer 26 as a mask, the contact hole reaching the wiring layer 16. Thereafter, the resist layer 26 is removed by well-known ashing.

Figure 4:
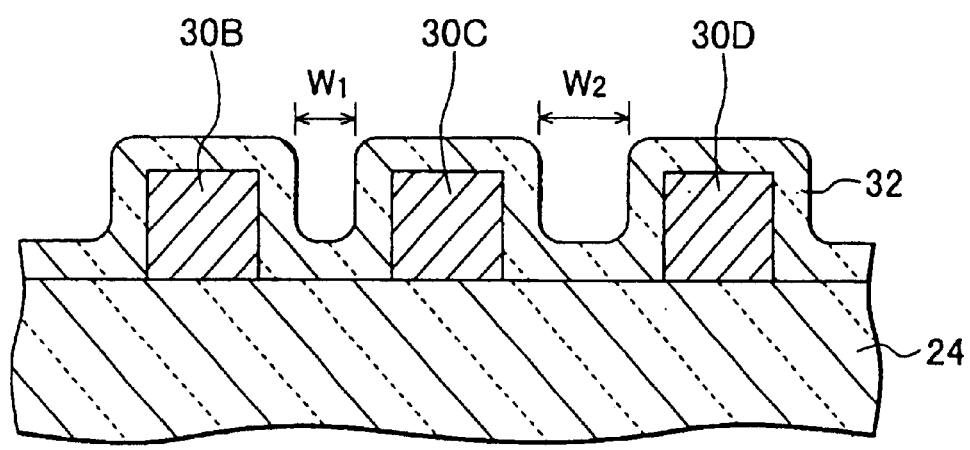
FIG. 4 is a cross sectional view of a substrate with parallel wiring layers covered with a surface protection film.

Next, as shown in FIG. 2H and FIGS. 3 and 4, wiring layers 30A, 30, 30B to 30D are formed. FIG. 4 shows the interlayer insulating film 24 and a wiring structure formed thereon. The wiring layer 30 is being connected via the contact hole 28 to the wiring layer 16. The wiring layers 30B to 30D are disposed in parallel, the wiring layer 30B being positioned at the left of the wiring layer 30C and the wiring layer 30D being positioned at the right of the wiring layer 30C.

The wiring layers 30A, 30, and 30B to 30D are formed by depositing wiring material on the interlayer insulating film 24 and in the contact hole 28 and thereafter pattering it by photolithography techniques and an anisotropic dry etching process. The wiring material is 20 nm thick Ti, 1000 nm thick Al alloy such as Al—Si—Cu, and 40 nm thick TiN, respectively deposited in this order from the substrate side by sputtering. The conditions of dry etching the wiring material layer may be:

Etching gas: $Cl_2$ (30 sccm)+$BCl_3$ (30 sccm)
Etching chamber pressure: 10 mTorr Next, as shown in FIG. 2I and FIGS. 3 and 4, a surface protection film 32 is formed on the interlayer insulating film 24, covering the wiring layers 30A, 30, and 30B to 30D. The surface protection film 32 is a silicon nitride film having a thickness of 150 nm formed by plasma CVD. The film forming conditions may be:

Substrate temperature: 400° C.
Source gas: $SiH_4$ (300 sccm)+$NH_3$ (1800 sccm)
+$N_2$ (1000 sccm)
Reaction chamber pressure: 2.6 Torr The surface protection film 32 of silicon nitride covering the wiring layers 30B to 30D is formed, as shown in FIG. 4, as thin as can form grooves between the wiring layers 30B and 30C and between the wiring layers 30C and 30D. Since air having a dielectric constant of 1 exists in the groove, the wiring capacitance can be reduced. The wiring capacitance can be reduced more the wider the widths $W_1$ and $W_2$ of the grooves. A high speed operation and a wide operation margin are therefore possible.

Thereafter, in order to reduce the process damages, the semiconductor substrate 10 having the structure shown in FIG. 2I and FIGS. 3 and 4 are subjected to heat treatment. The conditions of this heat treatment are, for example, 30 minutes at 400° C. in a nitrogen gas atmosphere. Hydrogen containing nitrogen gas may be used in place of nitrogen gas. The silicon nitride film is used as the surface passivation film 32. Since the silicon nitride film will not allow hydrogen to transmit therethrough, hydrogen may not be contained in the heat treatment atmosphere.

With the heat treatment, hydrogen resident in the hydrogen containing silicon oxide film 20 of the interlayer insulating film 24 is released from the hydrogen containing silicon oxide film 20. The released hydrogen transmits through the silicon oxide film 18, BPSG insulating film 14 and silicon oxide side spacers $K_1$ and $K_2$ respectively formed under the hydrogen containing silicon oxide film 20 (on the substrate side), and reaches the interface between the gate oxide film A and silicon substrate 10. Therefore, interfacial energy levels lower, which were generated by process damages in the channel region during MOS type transistor manufacture. The silicon oxide film 18, BPSG insulating film 14 and silicon oxide side spacers $K_1$ and $K_2$ constitute a hydrogen supply path from the hydrogen containing silicon oxide film to the channel region of the MOS type transistor.

During this heat treatment, the hydrogen containing silicon oxide film 20 is covered with the TEOS silicon oxide film 22 and silicon nitride film 32. Since the silicon nitride film 32 is hard to transmit hydrogen, the hydrogen resident in the hydrogen containing silicon oxide film 20 is confined to the layer lower than the silicon nitride film 32. This hydrogen is therefore effectively utilized for lowering interfacial energy levels. Even after this heat treatment, a predetermined amount of hydrogen is generally resident in the hydrogen containing silicon oxide film 20.

Figure 5:
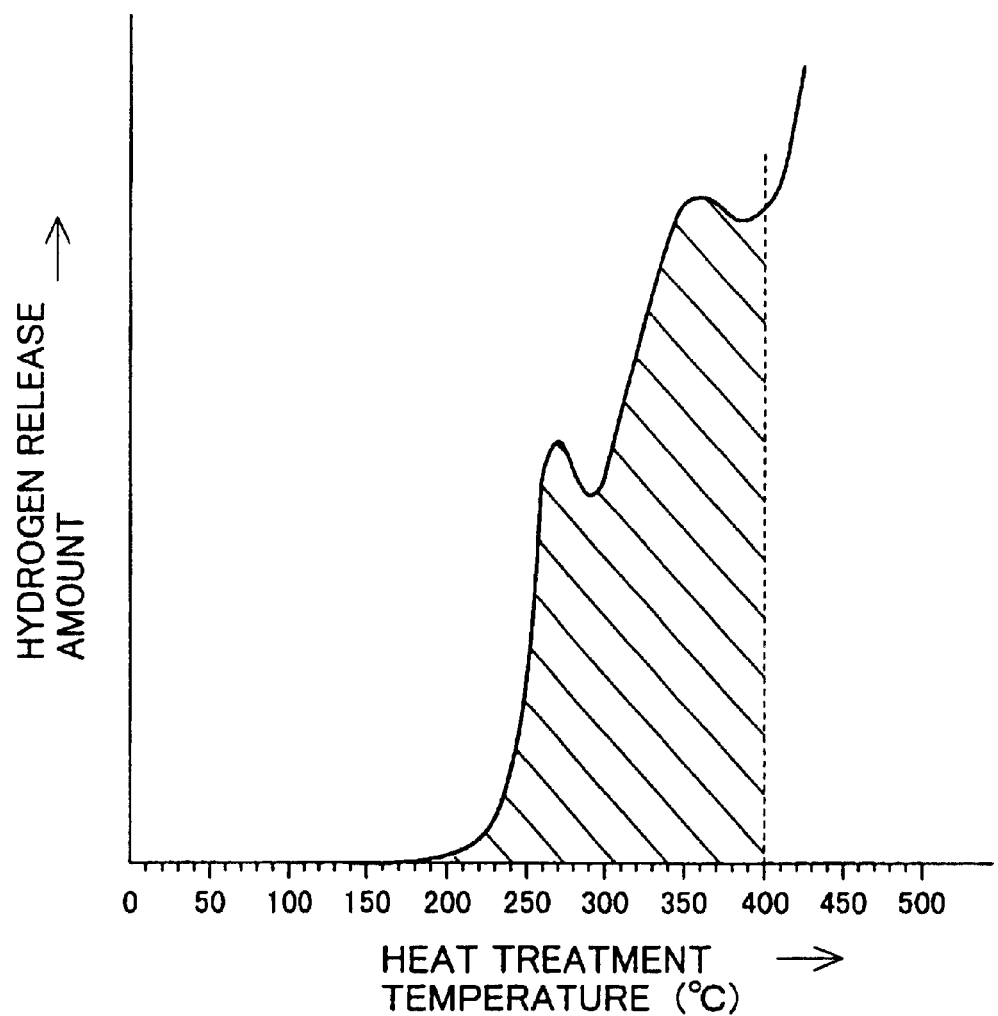
FIG. 5 is a graph showing an example of the hydrogen release characteristics, relative to a heat treatment temperature, of a silicon oxide film made of a hydrogen silsesquioxane resin film in a ceramic state.
Figure 6:
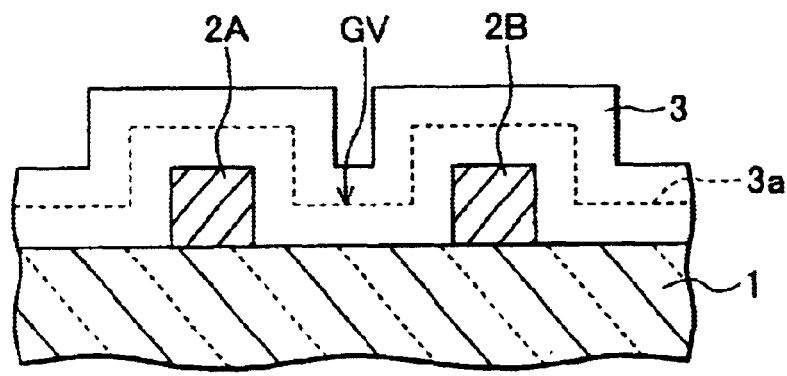
FIG. 6 is a cross sectional view showing an example of the surface protection structure of a conventional MOS type IC.
Figure 7:
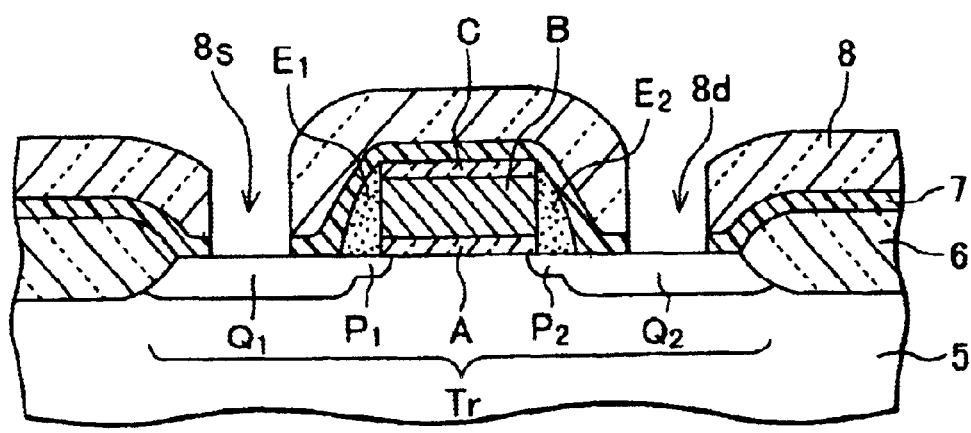
FIG. 7 is a cross sectional view of a substrate illustrating an example of a hydrogen annealing process of a conventional MOS type IC manufacture method.

FIG. 5 is a graph showing an example of the hydrogen release characteristics, relative to a heat treatment temperature, of a silicon oxide film made of a hydrogen silsesquioxane resin film in a ceramic state. The abscissa represents a heat treatment temperature and the ordinate represents a hydrogen release amount. For the heat treatment for suppressing process damages, the hydrogen release characteristics relative to the heat treatment temperature shown in FIG. 5 are prepared. It is desired that the heat treatment is performed at the temperature determined from the hydrogen release characteristics. The hydrogen release amount can be determined easily and the interfacial energy levels can be lowered reliably. In the example of the hydrogen release characteristics shown in FIG. 5, if the heat treatment is performed at 400° C., hydrogen in the slashed area is released. The released hydrogen diffuses into the channel region of the transistor TR and lowers the interfacial energy levels. It is therefore possible to lower a variation in threshold voltages of transistors TR.

The heat treatment for suppressing process damages is performed in the state that the wiring layers 30B to 30D are covered with the surface protection film 32 of silicon nitride as shown in FIG. 4. Therefore, lateral hillocks are not formed on the wiring layers 30B to 30D.

The present invention has been described in connection with the preferred embodiments. The invention is not limited only to the above embodiments. It is apparent that various modifications, improvements, combinations, and the like can be made by those skilled in the art.

What is claimed is:

1. A semiconductor device comprising:
   a semiconductor substrate;
   a MOS type transistor formed on said semiconductor substrate, said MOS type transistor including a source, a gate and a drain;
   an interlayer insulating film formed on the semiconductor substrate, said interlayer insulating film covering said MOS type transistor and including a hydrogen resident film which is a silicon oxide film containing a Si—H residue of 61% or less;
   a wiring layer formed on said interlayer insulating film; and
   a hydrogen transmission preventing film covering said MOS type transistor and said wiring layer.

2. A semiconductor device according to claim 1, wherein said hydrogen resident film contains hydrogen silsesquioxane resin.

3. A semiconductor device according to claim 1, wherein said hydrogen transmission preventing film includes a silicon nitride film.

4. A semiconductor device according to claim 1, wherein said wiring layer has a lamination structure of Ti/Al alloy/TiN.

5. A semiconductor device according to claim 1, wherein said wiring layer has a lamination structure Ti/Al—Si—Cu alloy/TiN.

6. A semiconductor device comprising:
   a semiconductor substrate;
   a MOS type transistor formed on said semiconductor substrate, said MOS type transistor including a source, a gate and a drain;
   an interlayer insulating film formed on the semiconductor substrate, said interlayer insulating film covering said MOS type transistor and including a hydrogen resident film;
   a wiring layer formed on said interlayer insulating film, wherein said wiring layer includes a plurality of adjacent wiring layers; and
   a hydrogen transmission preventing film covering said MOS type transistor and said wiring layer, and wherein said hydrogen transmission preventing film forms an air filled groove between adjacent wiring layers.

7. A semiconductor device according to claim 2, wherein a silicide film is formed on the source, the gate and the drain.

8. A semiconductor device according to claim 1, wherein a hydrogen supply path for supplying the channel region of the MOS type transistor is formed between the channel region and said hydrogen resident film.

9. A semiconductor device according to claim 1, wherein said silicon oxide film contains a Si—H residue of 23% or more.

10. A semiconductor device according to claim 1, wherein said hydrogen resident film can release hydrogen by being heated at a temperature determined from hydrogen release characteristics of said silicon oxide film.

* * * * *